United States Patent
Hu

(10) Patent No.: US 6,835,659 B2
(45) Date of Patent: Dec. 28, 2004

(54) ELECTRICAL COUPLING STACK AND PROCESSES FOR MAKING SAME

(75) Inventor: Y. Jeff Hu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 3 days.

(21) Appl. No.: 10/163,285

(22) Filed: Jun. 4, 2002

(65) Prior Publication Data

US 2003/0224597 A1 Dec. 4, 2003

(51) Int. Cl.[7] .............................................. H01L 21/44
(52) U.S. Cl. ..................................... 438/685; 438/655
(58) Field of Search ................................ 438/592, 649, 438/652, 655, 656, 682, 683, 685

(56) References Cited

U.S. PATENT DOCUMENTS

| | | | | | |
|---|---|---|---|---|---|
| 5,877,062 | A | * | 3/1999 | Horii .......................... | 438/396 |
| 5,907,188 | A | * | 5/1999 | Nakajima et al. ........... | 257/751 |
| 6,096,640 | A | * | 8/2000 | Hu .............................. | 438/652 |
| 6,156,630 | A | * | 12/2000 | Iyer ........................... | 438/888 |
| 2003/0207556 | A1 | * | 11/2003 | Werner et al. .............. | 438/592 |

OTHER PUBLICATIONS

"Denuded–WNx/poly–Si gate technology for deep sub–micron CMOS", Byung Hak Lee et al., VLSI and CAD, 1999. ICVC '99. 6th International Conference on Oct. 26–27, 1999 Page(s): 225–228.*

"In–situ barrier formation for high reliable W/barrier/poly–Si gate using denudation of WNx on polycrystalline" Si Byung Hak Lee et al.; Electron Devices Meeting, 1998. IEDM '98 Technical Digest., International , Dec. 6–9, 1998 Page(s): 385–388;.*

Hu et al. "Applications of Rapid Thermal Process to Nitridation of Tungsten and Denudation of WNx for Poly–Si/Metal Gates", Advanced Thermal Processing of Semiconductors, 2002. RTP 2002. 10th IEEE International Conference of , Sep. 25–27, 2002 Page(s): 125.*

Wolf, Stanley , et al., "Silicon Processing for the VLSI Era vol. 1", *Lattice Press, 2000*, (2000), 834–838.

* cited by examiner

Primary Examiner—Michael Tokar
Assistant Examiner—Lisa Kilday
(74) Attorney, Agent, or Firm—Schwegman, Lundberg, Woessner & Kluth, P.A.

(57) ABSTRACT

A process of making an electrical coupling stack is disclosed. A conductive structure is coupled to a substrate. The coupling includes a crystalline salicide first structure above the conductive structure, a nitrogen-containing amorphous salicide second structure above the crystalline salicide first structure, and a refractory metal third film above the nitrogen-containing amorphous salicide second structure. Processing includes depositing a refractory metal silicide first film over the conductive structure, depositing a refractory metal nitride second film over the refractory metal silicide first film, and depositing the refractory metal third film over the refractory metal nitride second film. Thermal processing is carried out to achieve the electrical coupling stack.

22 Claims, 8 Drawing Sheets

ELECTRICAL COUPLING STACK AND PROCESSES FOR MAKING SAME

FIELD OF THE INVENTION

The field of the invention relates to semiconductor processing. More particularly, one embodiment relates to a process of making an electrical coupling between semiconductive material and a metal. In particular, an embodiment relates to a process for making a tungsten buried digit line ("W BDL") stack. Another embodiment relates to a source/drain ("S/D") contact stack.

BACKGROUND

Semiconductor processing is an intensive activity during which several processes are integrated to achieve a working device. Miniaturization is the process of crowding more semiconductive devices onto a smaller substrate area in order to achieve better device speed, lower energy usage, and better device portability, among others. New processing methods must often be developed to enable miniaturization to be realized. One challenge is to prevent metal or metal silicide agglomeration during back-end-of-line ("BEOL") processing. The challenge to achieve digit line communication in a memory device that has a low resistivity, is often accompanied by the challenge to achieve a temperature-resistant digit line that is protected from the encroachment of damaging elements during BEOL processing, burn-in testing, and field use.

The advent of the buried digit line ("BDL") allowed for a lower overall profile of a dynamic random access memory ("DRAM") device. However, the average grain size ("gs") of a metallization continues to decrease in a manner that causes grains to form that follow the grain boundaries of a substrate. Accordingly, a higher than desirable resistivity persists despite miniaturization.

Another challenge is to fabricate shallow junctions with shallow source/drain ("S/D") structures that will receive a contact without entirely destroying the shallow S/D structure. Thus, what is needed is a conductive structure that overcomes some of the challenges of the prior art.

SUMMARY

The above mentioned problems and challenges are overcome by embodiments of this invention.

One embodiment is directed to a process of forming a tungsten buried digit line ("WBDL") stack on a substrate. The process includes forming a silicon-lean metal silicide first film over a polysilicon plug. Next, an amorphous metal nitride second film is formed by sputtering a metal nitride target above the first film. The amorphous metal nitride second film is covered with a refractory metal third film. A salicidation process causes the first film to form a salicide with the polysilicon plug. Because the buried digit line structures of active devices are formed according to embodiments of the present invention, a lower resistivity and a higher thermal processing yield are achieved.

Another embodiment is directed to a process of forming a source/drain ("S/D") contact stack structure. The process includes forming a silicon-lean metal silicide first film over a silicon S/D active area. Next, an amorphous metal nitride second film is formed by sputtering a metal nitride target above the first film. The amorphous metal nitride second film is covered with a refractory metal third film. A salicidation process causes the first film to form a salicide with the silicon S/D active area. Because the S/D contact stack structures are formed according to embodiments of the present invention, a lower resistivity and a higher thermal processing yield are achieved.

Another embodiment relates to a device that includes at least one of a BDL structure and a S/D contact stack. The device is packaged and implemented in a host. In one embodiment, the host includes a memory module, In another embodiment, the host includes a computer system with a processor, a memory system, and at least one I/O device connected to the host.

BRIEF DESCRIPTION OF THE DRAWINGS

In order to understand the manner in which embodiments of the present invention are obtained, a more particular description of the invention briefly described above will be rendered by reference to specific embodiments thereof which are illustrated in the appended drawings. Understanding that these drawings depict only typical embodiments of the invention that are not necessarily drawn to scale and are not therefore to be considered to be limiting of its scope, the invention will be described and explained with additional specificity and detail through the use of the accompanying drawings in which.

DETAILED DESCRIPTION

Figure 1:
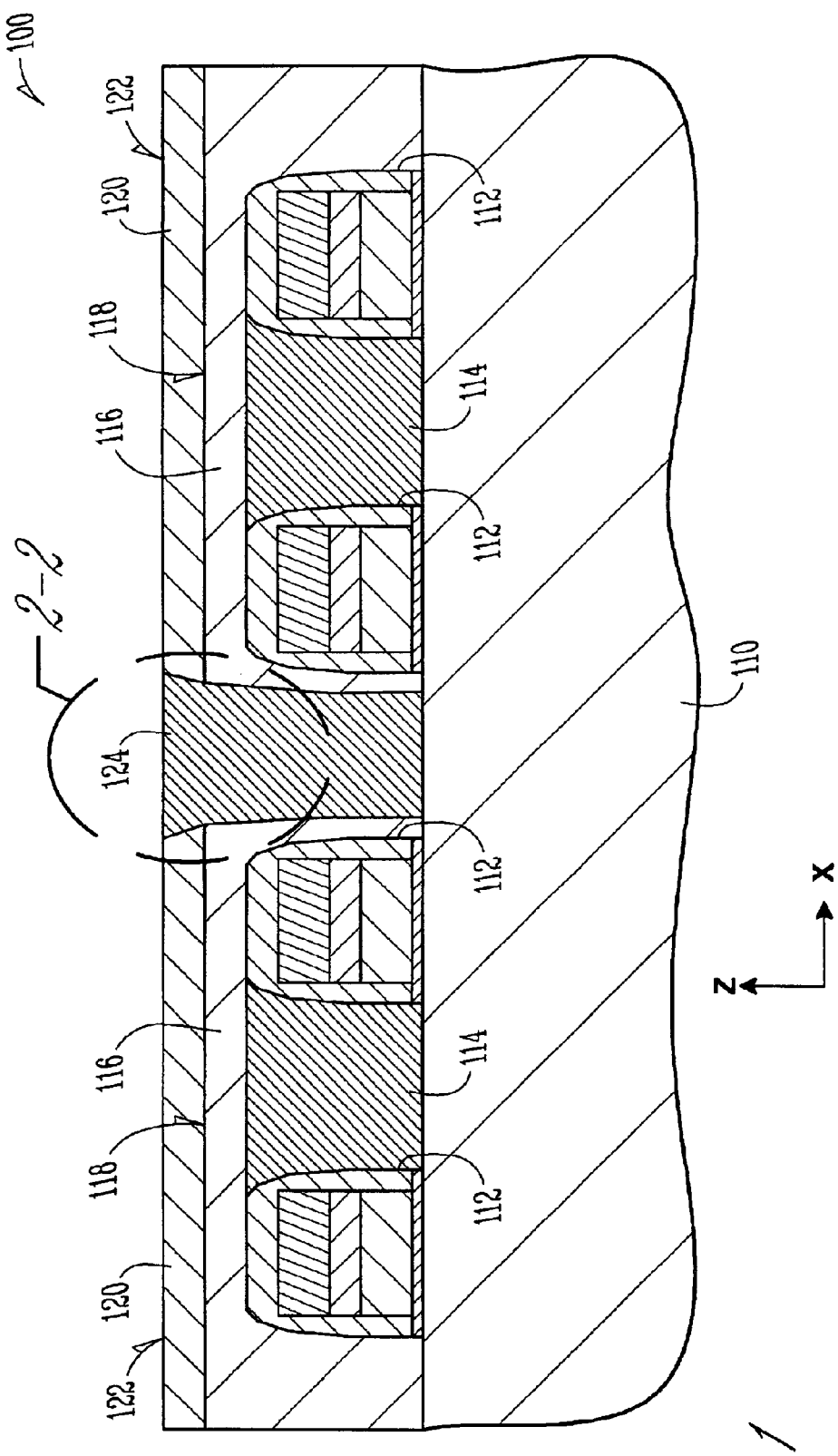
FIG. 1 is a cross section of a structure during processing according to an embodiment.

In the following detailed description, reference is made to the accompanying drawings which form a part hereof, and in which is shown, by way of illustration, specific ways which embodiments may be practiced. In the drawings, like numerals describe substantially similar components throughout the several views. These embodiments are described in sufficient detail to enable those skilled in the art to practice various embodiments. Other embodiments may be utilized and structural, logical, and electrical changes may be made without departing from the scope of the various embodiments. The terms wafer and substrate used in the following description include any structure having an exposed surface with which to form an integrated circuit ("IC") structure embodiment.

In the detailed description, the term "substrate" is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator or dielectric is defined to include any material that is less electrically conductive than the materials referred to as conductors.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

FIG. 1 is a cross section of a structure 100 during processing according to an embodiment. Although the structure 100 appears to be a precursor for a memory cell, embodiments are applicable to other semiconductive devices. A substrate 110 includes active areas (not pictured) and a plurality of gate stacks 112 on the substrate 110. The gate stacks 112 are spaced apart by conductive landing pads 114 that are precursors for communication to capacitative storage cells (not pictured). A first dielectric 116 is depicted as being deposited and etched back to a first upper surface 118, after which a second dielectric 120 is deposited and also etched back to a second upper surface 122. In one embodiment, the first dielectric 116 and the second dielectric 118 are borophosphosilicate glass ("BPSG"). Other dielectric materials may be used according to process flow needs. In one embodiment, the first dielectric 116 and the second dielectric 120 are a single structure that is formed by a deposition and an etchback such as a chemical-mechanical polishing ("CMP").

Between two gate stacks 112 a conductive structure such as a conductive plug 124 has been formed by etching to silicon of the substrate 112 by depositing a material such as polysilicon, and by etching back to the second upper surface 122. In one embodiment, the conductive plug 124 is made of polysilicon (hereinafter referred to as a polysilicon plug 124) that is filled into a contact corridor in the dielectric layer(s). By this process, the conductive landing pads 114 are isolated from the polysilicon plug 124. After further processing that is not set forth herein, it is noted that access to the conductive landing pads 114 is either in front of the plane of the figure or behind it. In other words, the cross section depicted in FIG. 1 is taken along an oblique line such that the conductive landing pads 114 include one in front of the polysilicon plug 124, and one behind the polysilicon plug 124 when viewed aligned along a rectilinear array (not pictured).

Figure 2:
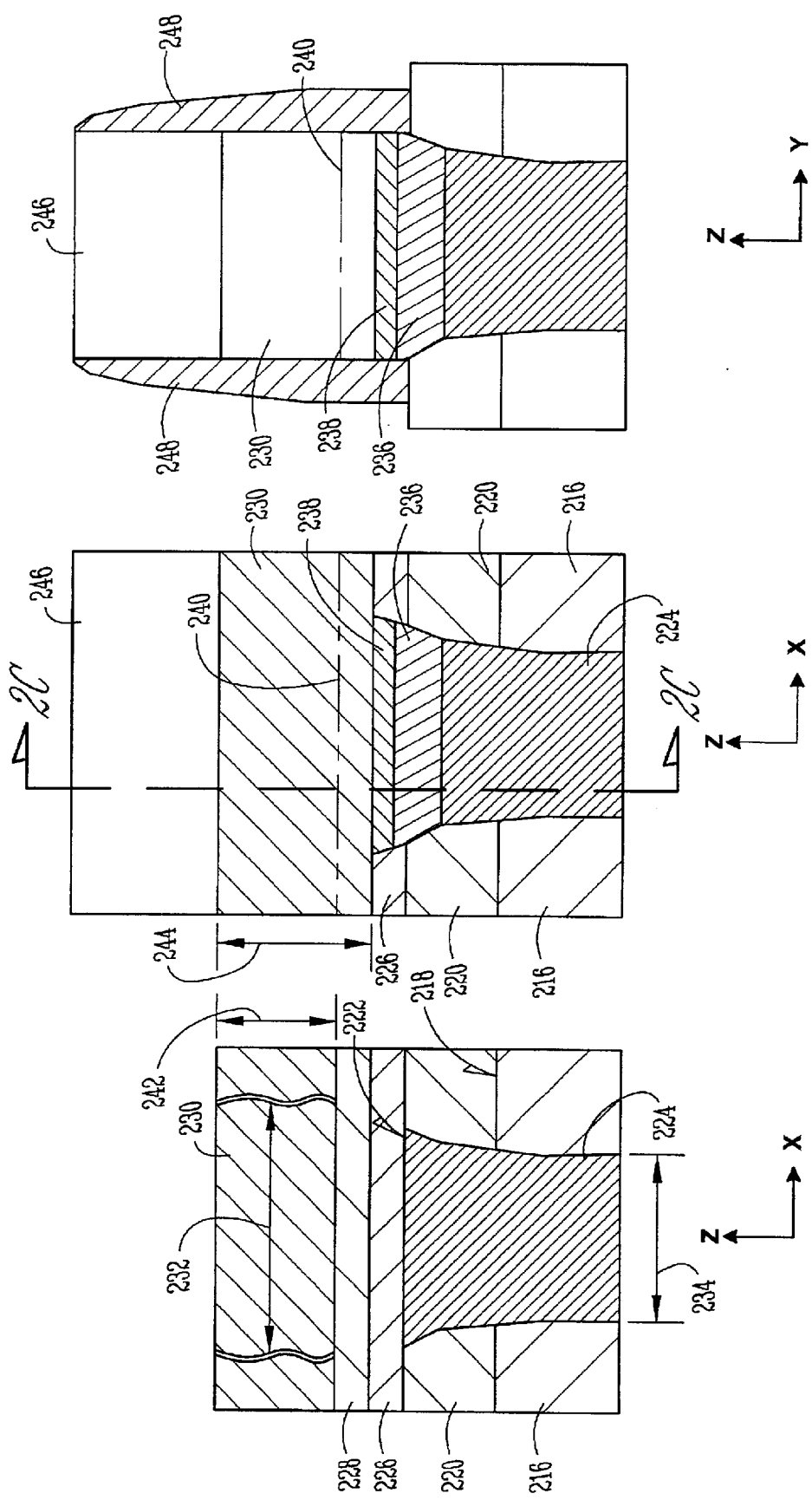
FIG. 2A is a section taken along the line 2—2 from the structure depicted in FIG. 1 after further processing according to an embodiment.
FIG. 2B is a cross section of the structure depicted in FIG. 2A after further processing.
FIG. 2C is a cross section of the structure depicted in FIG. 2B, taken orthogonal to the plane of FIG. 2B, along the line 2C–2C'.

A first general embodiment is depicted in FIGS. 2A to 2C. FIG. 2A is a section taken approximately along the line 2—2 from the structure 100 depicted in FIG. 1 after further processing. A first dielectric 216 is depicted as being deposited and etched back to a first upper surface 218, after which a second dielectric 220 is deposited and also etched back to a second upper surface 222. A polysilicon plug 224 is disposed in the first dielectric 216 and the second dielectric 220. In one embodiment, the first dielectric 216 and the second dielectric 220 are a single, blanket-deposited dielectric.

A refractory metal silicide first film 226 is formed by physical vapor deposition (PVD) over the polysilicon plug 224 as well as over the second dielectric 220. In one embodiment the refractory metal first film 226 is formed from a metal silicide target. In one embodiment, the refractory metal is selected from titanium (Ti), zirconium (Zr), hafnium (Hf), or combinations thereof. In one embodiment, the refractory metal is selected from vanadium, (V), niobium (Nb), tantalum, (Ta), or combinations thereof. In one embodiment, the refractory metal is selected from chromium (Cr), molybdenum (Mo), tungsten (W), or combinations thereof. In one embodiment, in lieu of a refractory metal, another metal silicide first film is used and the metal is selected from cobalt (Co), rhodium (Rh), iridium (Ir), or combinations thereof. In one embodiment, the metal is selected from nickel (Ni), palladium (Pd), platinum (Pt), or combinations thereof.

In one embodiment the refractory metal that is used, is generated from a refractory metal silicide target to form the refractory metal first film 226. According to this process embodiment, the refractory metal silicide first film 226 includes forming a solid solution of refractory metal silicide according to the formula $MSi_x$, and the refractory metal is M and $0 < x \leq 3$.

In another embodiment, forming the refractory metal silicide first film 226 is done by sputtering from a silicon-lean refractory metal silicide target such that the PVD process generates a refractory metal silicide first film 226 according to the formula of about $MSi_{0.6}$. In one embodiment, the refractory metal silicide first film 226 is according to the formula of about $TaSi_{0.6}$. In one embodiment, the refractory metal silicide first film 226 is according to the formula of about $MSi_{0.6}$, and M is TaTi and Ta varies from about 20% to about 99%. In one embodiment, the refractory metal silicide first film 226 is according to the formula of about $WSi_{0.6}$. In one embodiment, the refractory metal silicide first film 226 is according to the formula of about $MSi_{0.6}$, and M is WTi and W varies from about 20% to about 99%. In one embodiment, the refractory metal silicide first film 226 is according to the formula of about $MoSi_{0.6}$. In one embodiment, the refractory metal silicide first film 226 is according to the formula of about $MSi_{0.6}$, and M is MoTi and Mo varies from about 20% to about 99%. In one embodiment, the refractory metal silicide first film 228 is according to the formula of about $HfSi_{0.6}$. In one embodiment, the refractory metal silicide first film 228 is according to the formula of about $MSi_{0.6}$, and M is HfTi and Hf varies from about 20% to about 99%.

Although specific combinations are explicitly set forth above as embodiments, other combinations include TaW, TaWTi, TaMo, TaMoTi, TaHf, TaHfTi, WTi, WMo, WMoTi, WHf, WHfTi, MoHf, and MoHfTi. By the two-component combinations, the first element varies from about 20% to about 99%. By the three-component combinations, the first element varies from about 20% to about 90%, the second element varies from about 10% to about 80%, and the third element varies from about 0% to about 70%.

An amorphous refractory metal ("ARM") nitride second film 228 is formed after formation of the refractory metal silicide first film 226 according to an embodiment. The ARM nitride second film 228 is a compound or a compound composite of a refractory metal, or another metal, and nitrogen. The amount of nitrogen ranges from a doping quantity to stoichiometric. In one embodiment, the ARM nitride second film 128 is formed by PVD in the same tool that was used to form the refractory metal silicide first film 226. In another embodiment, a CVD process is used to form the ARM nitride second film 228. In yet another embodiment, an ALD process is used to form the ARM nitride second film 228.

The refractory metal that is used to form the ARM nitride second film 228, is a refractory metal such as set forth above for the various embodiments of the refractory metal nitride first film 226. One characteristic of the ARM nitride second film 228 is that it may release some of its nitrogen during thermal processing and after BEOL processing.

A refractory metal third film 230 is formed after the formation of the ARM nitride second film 228. In one embodiment, the refractory metal third film 230 is formed by PVD such as by sputtering a refractory metal target. In another embodiment, the refractory metal third film 230 is formed by CVD. In yet another embodiment, an ALD process is used to form the refractory metal third film 230.

As the refractory metal third film 230 has a dimension in one embodiment that is thicker than the first and second films 226 and 228, respectively, it acts as a major structure in a BDL for a memory device. As set forth above for refractory metal precursors for the first and second films 226 and 228, respectively, various refractory metals are useful for this embodiment.

In one embodiment, the refractory metal third film 230 is sputtered from a W target. In another embodiment, the refractory metal third film 230 is sputtered from a Ta target. In another embodiment, the refractory metal third film 230 is sputtered from a Ti target. Other target embodiments used in the process include TaW, TaWTi, TaMo, TaMoTi, TaHf, TaHfTi, WTi, WMo, WMoTi, WHf, WHfTi, Mo, MoTi, MoHf, MoHfTi, and HfTi. By the two-component combinations, the first element varies from about 20% to about 99%. By the three-component combinations, the first element varies from about 20% to about 90%, the second element varies from about 10% to about 80%, and the third element varies from about 0% to about 70%.

The average grain size 232 of the refractory metal third film 230 is in a range from about one-tenth the characteristic dimension 234 of the polysilicon plug 224 to greater than the characteristic dimension 234. The average grain size 232 depicted in FIG. 2A, is illustrated also in an arbitrary size, shape, and location (approximately centered over the polysilicon plug 224) for illustrative convenience according to an embodiment. Other average grain sizes, shapes, and locations are achievable according to various processing conditions set forth herein, and as known in the art.

The characteristic dimension 234 is tied to the process photolithography. For example, the characteristic dimension 234 can have a minimum feature geometry that is one of 0.25 micrometers (microns), 0.18 microns, 0.15 microns, 0.13 microns, and 0.11 microns. It is understood that the various metrics such as a 0.15-micron photolithography geometry may have different dimensions in a first business entity compared to a second business entity. Accordingly, such metrics, although quantitatively called out, may differ between two given business entities. Other minimum features that may be accomplished in the future are applicable to the present invention.

FIG. 2B is a cross section of the structure depicted in FIG. 2A after further processing. A substantially crystalline salicide structure 236 is grown from a portion of the polysilicon plug 224 and the refractory metal silicide first film 226. Further, an amorphous salicide structure 238 also results from the thermal processing. One distinction between the crystalline salicide structure 236 and the amorphous salicide structure 238 is that the crystalline salicide structure 236 has drawn sufficient silicon from the polysilicon plug 224, that a salicide material has formed according to the approximate formula of $MSi_2$. However, the amorphous salicide structure 238 retains an approximate formula of $MSi_x$ and $0 \leq x \leq 2$, not including the nitrogen.

It is noted that the refractory metal nitride second film 228 is not depicted in FIG. 2B. Depending upon the process conditions, remnants may exist, but they are not illustrated, or it may be transformed into a refractory metal layer by substantial denuding of nitrogen from the ARM nitride second film 228. It is further noted that a nitrogen gradient (not pictured) can appear in the amorphous salicide second structure 238. By denuding of nitrogen from the ARM nitride second film 228 into what is becoming the amorphous salicide second structure 238, process conditions such as time, temperature, and original nitrogen concentration will affect any nitrogen gradient in the amorphous salicide second structure 238.

By way of non-limiting example, where the refractory metal third film 230 is W, and where the ARM nitride second film 228 is $WN_x$, thermal processing drives the nitrogen into what is becoming the amorphous salicide structure 238. Accordingly, there may exist a boundary 240 that indicates a transition from the original W of the refractory metal third film 230 (FIG. 2A) to the W of the nitrogen-denuded refractory metal nitride second film 228 (also FIG. 2A). By "nitrogen-denuded" it is meant that about half or more of the nitrogen is driven out of the ARM nitride second film 228. It is also meant that the resulting amorphous salicide second structure 238 has a second degree of crystallinity that is less than the degree of crystallinity of the crystalline salicide first structure 236. According to this example, the thickness 242 (FIG. 2A) of the refractory metal third film 230 increases to the thickness 244 (FIG. 2B) of the refractory metal third film 230 and the nitrogen-denuded ARM nitride second film 228 (pictured only in FIG. 2A). The metal third film 30 with the joinder of two identical metals may be referred to as a "metal-annexed third film".

Similarly, if the ARM nitride second film 228 (FIG. 2A) includes metal or metals that will alloy with the refractory metal third film 230 (FIG. 2A), the boundary 240 indicates an alloy transition zone between the metal of refractory metal third film 230 and the nitrogen-denuded ARM nitride second film 228. The refractory metal third film 230 with the joinder of two alloyable metals may be referred to as a "metal-alloy-annexed third film". Further, if the ARM nitride second film 228 (FIG. 2A) includes metal or metals that will form an eutectic with the refractory metal third film 230 (FIG. 2A), the boundary 240 indicates an eutectic transition zone between the metal of refractory metal third film 230 and the nitrogen-denuded ARM nitride second film 228. The refractory metal third film 230 with the joinder of two metals that form an eutectic zone may be referred to as a "metal-eutectic annexed third film". Additionally, if the ARM nitride second film 228 (FIG. 2A) includes metal or metals that resists either alloying or forming an eutectic, the boundary 240 indicates a metal-metal transition zone between the metal of refractory metal third film 230 and the nitrogen-denuded ARM nitride second film 228. The metal third film 230 with the joinder of two non-alloying, non-eutectic-forming metals may be referred to as a "metal-metal annexed third film".

At least three effects are notable by formation of the crystalline salicide structure 236 and the amorphous salicide structure 238. First, at least one of the transition zones forms at the boundary 240 as set forth above. Second, an amorphous nitride salicide structure 238 forms, or a nitrogen-doped amorphous salicide structure 238 forms. The amount of nitrogen that is driven into the amorphous salicide structure 238 defines whether the structure 238 is "doped" or "nitride salicide" according to art-recognized concentrations. Third, consumption of some of the polysilicon plug 224 also occurs to form the crystalline salicide structure 236.

In one embodiment, salicidation is carried out at a temperature at which nitrogen is substantially denuded from the ARM nitride second film 228 (FIG. 2A). In one embodiment, a first heating is done at a temperature range from about 650° C. to about 850° C. In any event, the first heating temperature is high enough to cause salicidation between the polysilicon plug 224 and the refractory metal silicide first film 226 (FIG. 2A). The first heating is also high enough to cause the nitrogen to migrate into what forms the amorphous salicide structure 238. In one embodiment, nitrogen remains substantially in the amorphous salicide structure 238 and does not penetrate into the crystalline salicide structure 236.

FIG. 2C is a cross section of the structure depicted in FIG. 2B, taken orthogonal to the plane of FIG. 2B, along the line 2C–2C'. After further processing, a dielectric cap layer 246 (hereinafter, by way of non-limiting example, a "nitride cap layer 246") is formed. In one embodiment, the nitride cap layer 246 is formed before growth of the crystalline salicide structure 236 and the amorphous salicide structure 238. In another embodiment, the nitride cap layer 246 is grown during formation of the salicide structure 236 and the amorphous salicide structure 238. In yet another embodiment, the nitride cap layer 246 is grown after formation of the salicide structure 236 and the amorphous salicide structure 238.

As depicted in FIG. 2C, a BDL structure is completed with the formation of a digit line spacer 248. In one embodiment, the digit line spacer 248 is replaced with a blanket dielectric deposition (not pictured) that covers an array of BDLs. The BDL includes the crystalline salicide structure 236 and the amorphous salicide structure 238 that form a crystalline salicide first film and an amorphous salicide second film, respectively. The BDL also includes what is left of the ARM nitride second film 228 (FIG. 2A), although it may be substantially denuded of nitrogen and/or annexed with the refractory metal third film 230.

The BDL structure is fabricated with varying film thicknesses. Reference to FIGS. 2A–2C may be used for the following two examples. In a first example (Example 1) of the first general embodiment, a WBDL stack was formed by sputtering about 200 Å $TaSi_{0.6}$ onto a polysilicon substrate to form a refractory metal silicide first film. Thereafter, about 150 Å of $WN_x$ was sputtered onto the refractory metal first film to form a refractory metal nitride second film. The amount of N in the $WN_x$ is varied from about $0.01 \leq x \leq 1$ and can be controlled by sputtering in the presence of nitrogen, or sputtering a $WN_x$ target, or both. After formation of the refractory metal nitride second film of $WN_x$, a refractory metal third film was CVD formed to a thickness of about 350 Å. Alternatively, the refractory nitride second film was sputtered from a tungsten target. Thermal processing was next carried out. A rapid thermal anneal (RTA) was carried out at about 750° C. for a time from about 10 seconds to about 2 minutes such that a crystalline salicide first film formed from the refractory metal silicide first film and the polysilicon substrate. The crystalline salicide first film had the stoichiometry of approximately $TaSi_2$. The crystalline salicide first film consumed a total of the polysilicon substrate of about 25–30 Å. An amorphous salicide second film formed above the crystalline salicide first film. By the RTA process, at least half of the nitrogen was denuded from what was the $WN_x$ second film. Accordingly, the W third film grew from about 350 Å to about 450 Å. Therefore, the remnant of the $WN_x$ second film was substantially annexed by the W third film. The amorphous salicide second film became approximately $TaSi_x$, and x<2 not including the nitrogen, and it was about 132 Å thick. The crystalline salicide first film became approximately $TaSi_2$, and it was about 81 Å thick.

In a second example (Example 2) of the first general embodiment, a WBDL stack was formed by sputtering about 200 Å $TaSi_{0.6}$ onto a polysilicon substrate to form a refractory metal silicide first film. Thereafter, about 50 Å of $WN_x$ was sputtered onto the refractory metal first film to form a refractory metal nitride second film. The amount of N in the $WN_x$ is varied from about $0.01 \leq x \leq 1$ and can be controlled by sputtering in the presence of nitrogen, or sputtering a $WN_x$ target, or both. After formation of the refractory metal nitride second film of $WN_x$, a refractory metal third film was sputtered from a tungsten target to a thickness of about 350 Å. Thermal processing was next carried out. An RTA was carried out at about 750° C. for a time from about 10 seconds to about 2 minutes such that a crystalline salicide first film formed from the refractory metal silicide first film and the polysilicon substrate. The crystalline salicide first film had the stoichiometry of approximately $TaSi_2$. The crystalline salicide first film consumed a total of the polysilicon substrate of about 99 Å. An amorphous salicide second film formed above the crystalline salicide first film. By the RTA process at least half of the nitrogen was denuded from what was the $WN_x$ second film. Accordingly, the W third film grew from about 350 Å to about 380 Å. Therefore, the remnant of the $WN_x$ second film was substantially annexed by the W third film. The amorphous salicide second film became approximately $TaSi_x$ not including the nitrogen, and x<2, and it was about 90 Å thick. The crystalline salicide first film became approximately $TaSi_2$, and it was about 210 Å thick.

Examples 3–6 are set forth in Table 1 to illustrate various film thickness for the first general embodiment.

TABLE 1

WBDL Structures, all thicknesses in Å

| | Example 3 | Example 4 | Example 5 | Example 6 |
|---|---|---|---|---|
| Dielectric cap | 200 | 500 | 1,000 | 1,500 |
| 3rd film, W | 50 | 200 | 350 | 500 |
| 2nd film, α-$TaSi_x$ | 20 | 50 | 100 | 200 |
| 1st film, c-$TaSi_2$ | 30 | 70 | 130 | 300 |

*Includes some N.

Resistivity in the WBDL third film is measured in a range from about 2.9 Ω/sq to about 30 Ω/sq. The average grain size for the WBDL third film depicted in Table 1, is in a range from about 20 nm to about 500 nm. In another embodiment, the average grain size is in a range from about 30 nm to about 150 nm.

Figure 3:
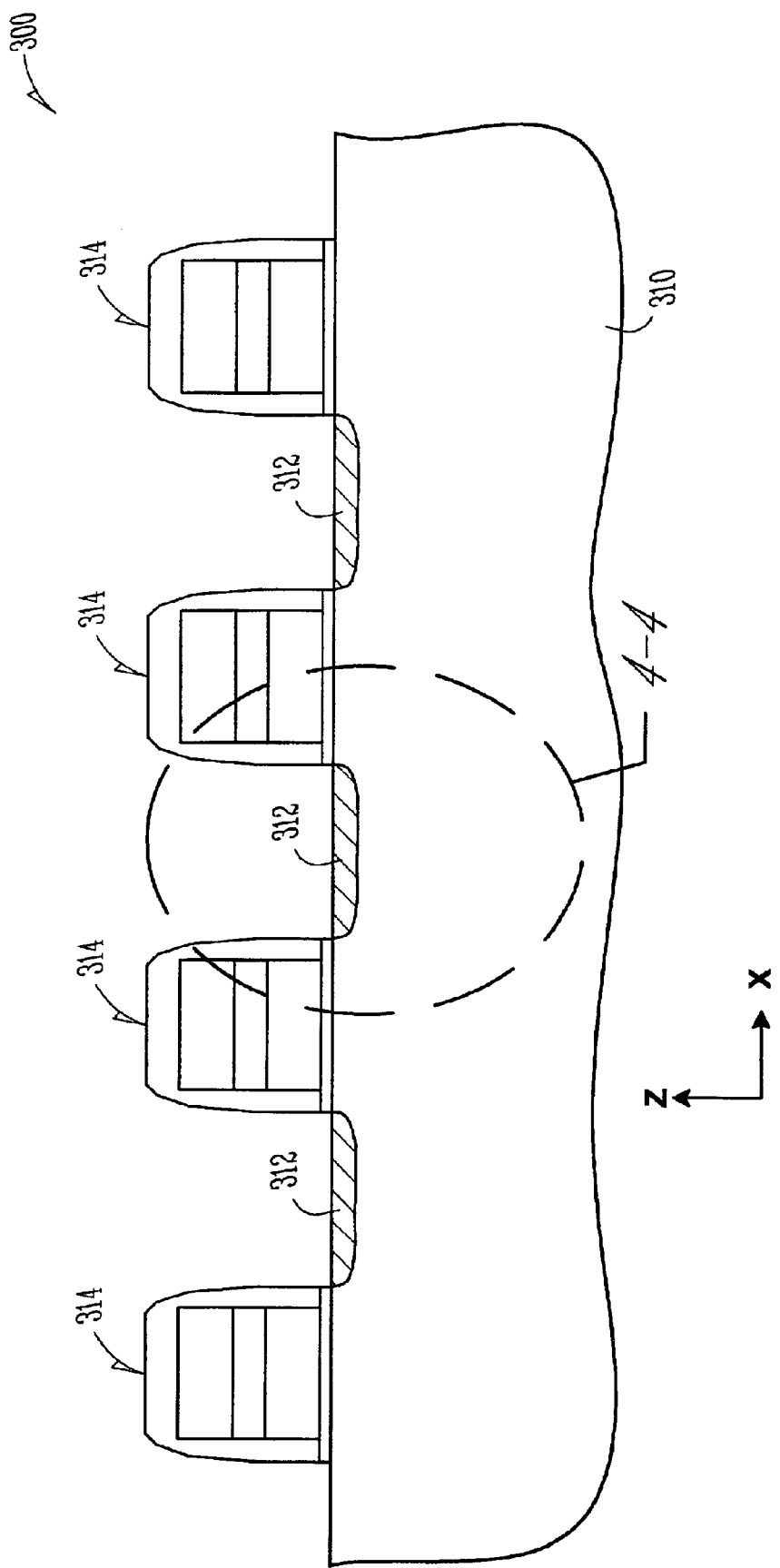
FIG. 3 is a cross section of a structure during processing according to an embodiment.

FIG. 3 is a cross section of a structure 300 during processing according to an embodiment. The structure 300 may be a precursor for a memory cell, an array of gates for sense amplifiers, or other structures such as logic circuits that are applicable to other semiconductive devices. A substrate 310 includes active areas that include an S/D structure 312 and a gate stack 314 on the substrate 310. The gate stack 314 is spaced apart from a second gate stack 314 by the S/D structure 312 that can be self-aligned therebetween.

Figure 4B:
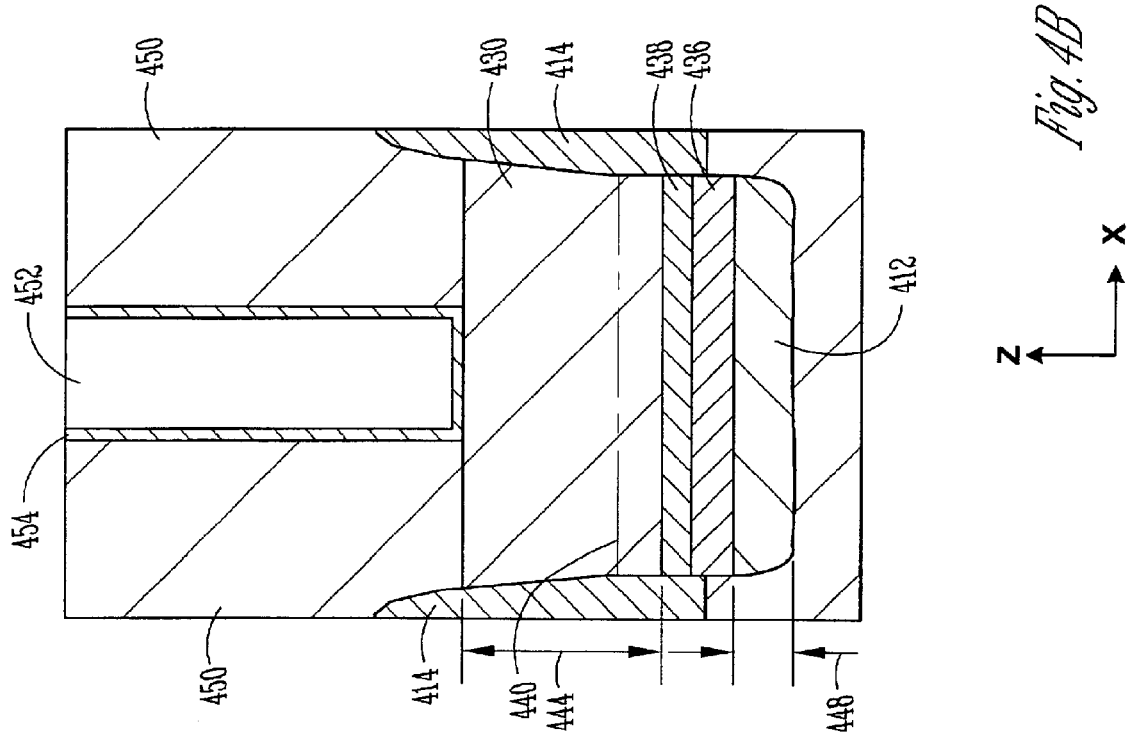
FIG. 4B is a cross section of the structure depicted in FIG. 4A after further processing.
Figure 4A:
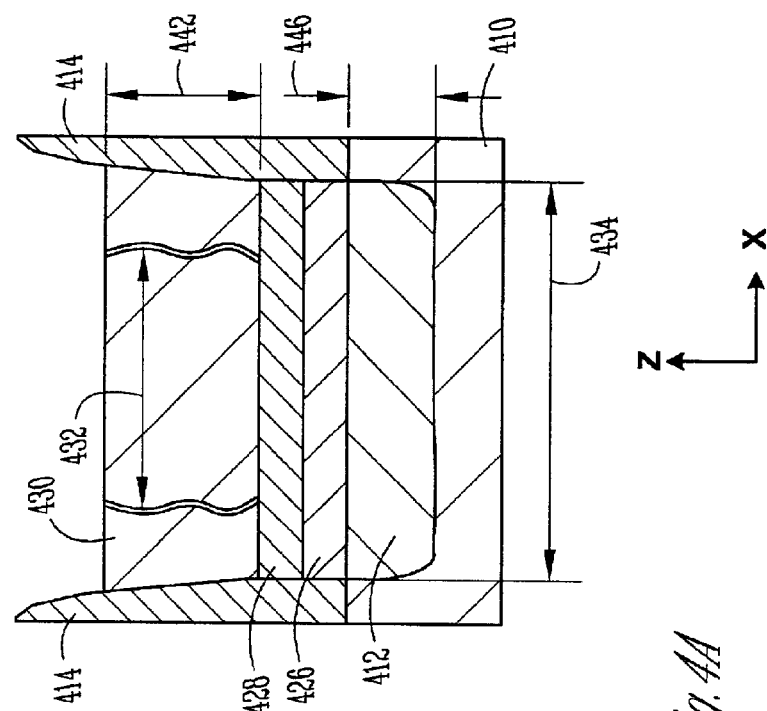
FIG. 4A is a section taken along the line 4—4 from the structure depicted in FIG. 3 after further processing according to an embodiment.

A second general embodiment is depicted in FIGS. 4A and 4B. FIG. 4A is a section taken approximately along the line 4—4 from the structure 300 depicted in FIG. 3 after further processing according to an embodiment. A substrate 410 includes a S/D structure 412 that appears self-aligned between the spacer structures of two gate stacks 414.

A refractory metal silicide first film 426 is formed by PVD over the S/D structure 412. In one embodiment, the refractory metal is selected from Ti, Zr, Hf, or combinations thereof. In one embodiment, the refractory metal is selected from V, Nb, Ta, or combinations thereof. In one embodiment, the refractory metal is selected from Cr, Mo, W, or combinations thereof. In one embodiment another metal is selected in lieu of a refractory metal. In one embodiment, the metal is selected from Co, Rh, Ir, or combinations thereof. In one embodiment, the metal is selected from Ni, Pd, Pt, or combinations thereof.

In one embodiment the refractory metal that is used, is generated from a refractory metal silicide target to form the refractory metal silicide first film 426. According to this process embodiment, the refractory metal silicide first film 426 includes forming a refractory metal silicide according to the formula $MSi_x$, and the refractory metal is M and $0<x\leq3$.

In another embodiment, forming the refractory metal silicide first film 426 is done by sputtering from a silicon-lean refractory metal silicide target such that the PVD process generates a refractory metal silicide first film 426 according to the formula of about $MSi_{0.6}$. In one embodiment, the refractory metal silicide first film 426 is according to the formula of about $TaSi_{0.6}$. In one embodiment, the refractory metal silicide first film 426 is according to the formula of about $MSi_{0.6}$, and M is TaTi and Ta varies from about 20% to about 99%. In one embodiment, the refractory metal silicide first film 426 is according to the formula of about $WSi_{0.6}$. In one embodiment, the refractory metal silicide first film 426 is according to the formula of about $MSi_{0.6}$, and M is WTi and W varies from about 20% to about 99%. In one embodiment, the refractory metal silicide first film 426 is according to the formula of about $MoSi_{0.6}$. In one embodiment, the refractory metal silicide first film 426 is according to the formula of about $MSi_{0.6}$, and M is MoTi and Mo varies from about 20% to about 99%. In one embodiment, the refractory metal silicide first film 426 is according to the formula of about $HfSi_{0.6}$. In one embodiment, the refractory metal silicide first film 426 is according to the formula of about $MSi_{0.6}$, and M is HfTi and Hf varies from about 20% to about 99%. Although specific combinations are explicitly set forth above as embodiments, other combinations include TaW, TaWTi, TaMo, TaMoTi, TaHf, TaHfTi, WTi, WMo, WMoTi, WHf, WHfTi, MoHf, and MoHfTi. By the two-component combinations, the first element varies from about 20% to about 99%. By the three-component combinations, the first element varies from about 20% to about 90%, the second element varies from about 10% to about 80%, and the third element varies from about 0% to about 70%.

An ARM nitride second film 428 is formed after PVD formation of the refractory metal silicide first film 426 according to an embodiment. The ARM nitride second film 428 is a solid solution of a refractory metal and nitrogen. The amount of nitrogen ranges from a doping quantity to stoichiometric. In one embodiment, the ARM nitride second film 428 is formed by PVD in the same tool that was used to form the refractory metal silicide first film 426. In another embodiment, a CVD process is used to form the ARM nitride second film 428. In yet another embodiment, an ALD process is used to form the ARM nitride second film 428.

The refractory metal that is used to form the ARM nitride second film 428, is a refractory metal such as set forth above for the various embodiments of the refractory metal silicide first film 426. One characteristic of the ARM nitride second film 428 is that it releases some or substantially all of its nitrogen during further thermal processing.

A refractory metal third film 430 is formed after the formation of the ARM nitride second film 428. In one embodiment, the refractory metal third film 430 is formed by PVD such as by sputtering a refractory metal target. In another embodiment, the refractory metal third film 430 is formed by CVD. In yet another embodiment, an ALD process is used to form the refractory metal third film 430.

As the refractory metal third film 430 has a dimension in one embodiment that is thicker than the first and second films 426 and 428 respectively, it acts as a major structure in a S/D contact stack for a metal oxide semiconductor field-effect transistor ("MOSFET"). As set forth above for refractory metal precursors for the first and second films 426 and 428, respectively, various refractory metals are useful for this embodiment.

In one embodiment, the refractory metal third film 430 is sputtered from a W target. In another embodiment, the refractory metal third film 430 is sputtered from a Ta target. In another embodiment, the refractory metal third film 430 is sputtered from a Ti target. Other target embodiments used in the process include TaW, TaWTi, TaMo, TaMoTi, TaHf, TaHfTi, WTi, WMo, WMoTi, WHf, WHfTi, Mo, MoTi, MoHf, MoHfTi, and HfTi. By the two-component combinations, the first element varies from about 20% to about 99%. By the three-component combinations, the first element varies from about 20% to about 90%, the second element varies from about 10% to about 80%, and the third element varies from about 0% to about 70%.

The average grain size 432 of the refractory metal third film 430 is in a range from about one-twentieth the characteristic dimension 434 of the S/D structure 412 to greater than the characteristic dimension 434. The average grain size 432 depicted in FIG. 4A, is illustrated also in an arbitrary size, shape, and location (roughly centered over the S/D structure 412) for illustrative convenience according to an embodiment. Other average grain sizes, shapes, and locations are achievable according to various processing conditions set forth herein, and as known in the art.

The characteristic dimension 434 of the S/D structure 412 is tied to the process photolithography. For example, the characteristic dimension can have a minimum feature geometry that is one of 0.25 microns, 0.18 microns, 0.15 microns, 0.13 microns, 0.11 microns, and even smaller.

FIG. 4B is a cross section of the structure depicted in FIG. 4A after further processing. A substantially crystalline salicide structure 436 is grown from a portion of the S/D structure 412 and the refractory metal silicide first film 426 (FIG. 4A). Further, an amorphous salicide structure 438 also results from the thermal processing. One distinction between the crystalline salicide structure 436 and the amorphous salicide structure 438 is that the crystalline salicide structure 436 has drawn upon sufficient silicon from the S/D structure 412, that a salicide material has formed according to the approximate formula of $MSi_2$. However, the amorphous salicide structure 438 retains an approximate formula of $MSi_x$ not including the nitrogen, and $0 \leq x \leq 2$.

It is noted that the refractory metal nitride second film 428 is not depicted in FIG. 4B. Depending upon the process conditions, remnants may exist, but they are not illustrated, or it may have given up enough nitrogen to lower structures, that it becomes annexed into the refractory metal third film 430.

By way of non-limiting example, where the refractory metal third film 430 is W, and where the refractory metal nitride second film 428 is $WN_x$, thermal processing drives the nitrogen into what is becoming the amorphous salicide structure 438. Accordingly, there can exist a boundary 440 that indicates a transition from the original W of the refractory metal third film 430 (FIG. 4A) to the W of the nitrogen-denuded ARM nitride second film 428 (also FIG. 4A). According to this example, the thickness 442 (FIG. 4A) of the refractory metal third film 230 increases to the thickness 444 (FIG. 4B) of the refractory metal third film 430 and the nitrogen-denuded ARM nitride second film 428 (pictured only in FIG. 4A).

Similarly, if the refractory metal nitride second film 428 (FIG. 4A) includes metal or metals that will alloy with the refractory metal third film 430 (FIG. 4A), the boundary 440 indicates a metal-alloy transition zone between the metal of refractory metal third film 430 and the nitrogen-denuded ARM nitride second film 428. Further, if the refractory metal nitride second film 428 (FIG. 4A) includes metal or metals that will form an eutectic with the refractory metal third film 430 (FIG. 4A), the boundary 440 indicates a metal-eutectic transition zone between the metal of refractory metal third film 430 and the nitrogen-denuded ARM nitride second film 428. Additionally, if the ARM nitride second film 428 (FIG. 4A) includes metal or metals that resists either alloying or forming an eutectic, the boundary 440 indicates a metal-metal transition zone between the metal of refractory metal third film 430 and the nitrogen-denuded refractory metal nitride second film 428.

At least three effects are notable by formation of the crystalline salicide structure 436 and the amorphous salicide structure 438. First, at least one of the transition zones forms at the boundary 440 as set forth above. Second, an amorphous nitride salicide structure 438 forms, or a nitrogen-doped amorphous salicide structure 438 forms. The amount of nitrogen that is driven out of the refractory metal nitride second film 428 (FIG. 4A, also referred to as the S/D junction thickness 446) defines whether the amorphous salicide structure 438 is "doped" or "nitride salicide". Third, consumption of some of the S/D junction thickness 446 also occurs to form the crystalline salicide structure 436. In one embodiment, about one-tenth or less of the S/D junction thickness 446 (FIG. 4A) is consumed to a final thickness 448 (FIG. 4B). In another embodiment, about one-fifth or less of the S/D junction thickness 446 is consumed to a final thickness 448. In another embodiment, about one-fourth or less of the S/D junction thickness 446 is consumed to a final thickness 448. In another embodiment, about one-third or less of the S/D junction thickness 446 is consumed to a final thickness 448. In another embodiment, about one-half or less of the S/D junction thickness 446 is consumed to a final thickness 448. In yet another embodiment, more than one-half of the S/D junction thickness 446 is consumed to a final thickness 448.

In one embodiment, salicidation is carried out at a temperature at which nitrogen is substantially denuded from the ARM nitride second film 228 (FIG. 2A). In one embodiment, a heating is done at a temperature range from about 650° C. to about 850° C. In another embodiment, a heating is done at a temperature range from about 750° C. to about 850° C. In any event, the heating temperature is high enough to cause salicidation between the S/D structure 412 and the refractory metal silicide first film 426. It is also high enough to cause the nitrogen to migrate into what forms the amorphous salicide structure 438.

FIG. 4B also illustrates further processing. A bulk dielectric layer 450 is formed over the refractory metal third film 430 and the gate stacks 414, and a contact 452 makes an electrical coupling to the refractory metal third film 430. In one embodiment, the bulk dielectric layer 450 is a borophosphsilicate glass ("BPSG"). In another embodiment, the bulk dielectric layer 450 is formed by the decomposition of tetraethylortho silicate ("TEOS"). In one embodiment, the contact 452 is lined with a material 454 such as titanium or titanium nitride.

As depicted in FIG. 4B, a S/D contact stack is coupled with the formation of the contact 452 in the bulk dielectric layer 450. The S/D contact stack includes the crystalline salicide structure 436 that forms a salicide first film 436, and the amorphous salicide structure 438 that forms a salicide second film 438. As depicted in FIG. 4B, the salicide first film 436 includes a stoichiometry of about $MSi_2$ and it includes a first amount of crystallinity. Further, the S/D contact stack also includes the amorphous salicide second film 438 that includes a second amount of crystallinity that is less than the first amount of crystallinity. The S/D contact stack structure is fabricated with varying film thicknesses. For example, where the S/D structure 412 (FIG. 4A) is about 300 Å deep, the salicide first film 436 encroaches into the S/D structure 412 about 100 Å. Other encroachment amounts are set forth above, and are selected depending upon the depth of the S/D structure 412, the process integration needs, the materials being used, and other parameters.

The S/D stack structure is fabricated with varying film thicknesses. Reference to FIGS. 4A and 4B may be used for the following example. In a first example (Example 7) of the second general embodiment, a S/D stack is formed by sputtering a refractory metal first film to a thickness in a range from about 25 Å to about 200 Å $TaSi_{0.6}$ onto a monocrystalline S/D structure that is in a thickness range from about 400 Å to about 1,200 Å. The sputtering forms a refractory metal silicide first film. Thereafter, a tungsten nitride second film is CVD formed onto the refractory metal first film in a thickness range from about 20 Å to about 150 Å of $WN_x$. Alternatively, the tungsten nitride second film can be sputtered. The amount of N in the $WN_x$ is varied from about $0.01 \leq x \leq 1$ and can be controlled by sputtering in the presence of nitrogen, or sputtering a $WN_x$ target, or both. After formation of the refractory metal nitride second film of $WN_x$, a refractory metal third film is sputtered from a tungsten target to a thickness in a range from about 40 Å to about 3,000 Å.

Thermal processing is next carried out. A rapid thermal anneal (RTA) is carried out at about 750° C. for a time from about 10 seconds to about 2 minutes such that a crystalline salicide first structure forms from the refractory metal silicide first film and a portion of the S/D structure. The crystalline salicide first structure has the stoichiometry of approximately $TaSi_2$. An amorphous salicide second structure also forms above the crystalline salicide first structure.

The crystalline salicide first structure consumes a total of the monocrystalline S/D structure in a range from about 3 Å to about 100 Å. The amorphous salicide second structure has the stoichiometry of approximately $TaSi_x$ and $0.01 \leq x \leq 1$ not including the nitrogen. By the RTA process, nitrogen is denuded from what was the $WN_x$ second structure (at least half of the nitrogen) and is driven into the amorphous salicide second structure. Accordingly, the W third film grows from its original thickness to include substantially the thickness of the $WN_x$ second film. Therefore, the remnant of the $WN_x$ second film is substantially annexed to the refractory metal third film. The amorphous salicide second structure becomes $TaSi_x$ not including the nitrogen, x<2, and it is about two-thirds the original thickness of the refractory metal silicide first film. The crystalline salicide first structure becomes approximately $TaSi_2$, and it is about one-third the original thickness of the refractory metal silicide first film. The crystalline salicide first structure encroaches into the S/D structure in a range from about one-tenth its depth or less, to more that about one-half its depth.

Examples 8–11 are set forth in Table 2 to illustrate various film-thickness embodiments.

TABLE 2

S/D Stack Structures, all thicknesses in Å

| | Example 8 | Example 9 | Example 10 | Example 11 |
|---|---|---|---|---|
| 3rd film, W | 50 | 200 | 350 | 500 |
| 2nd film*, α-$TaSi_x$ | 20 | 50 | 100 | 200 |
| 1st film*, c-$TaSi_2$ | 30 | 70 | 130 | 300 |

*x ≤ 2. Includes some N.

Resistivity in the S/D stack third film is measured in a range from about 2.9 Ω/sq to about 30 Ω/sq. The average grain size for the third film depicted in Table 2, is in a range from about 20 nm to about 500 nm. In another embodiment, the average grain size is in a range from about 30 nm to about 150 nm.

Figure 5:
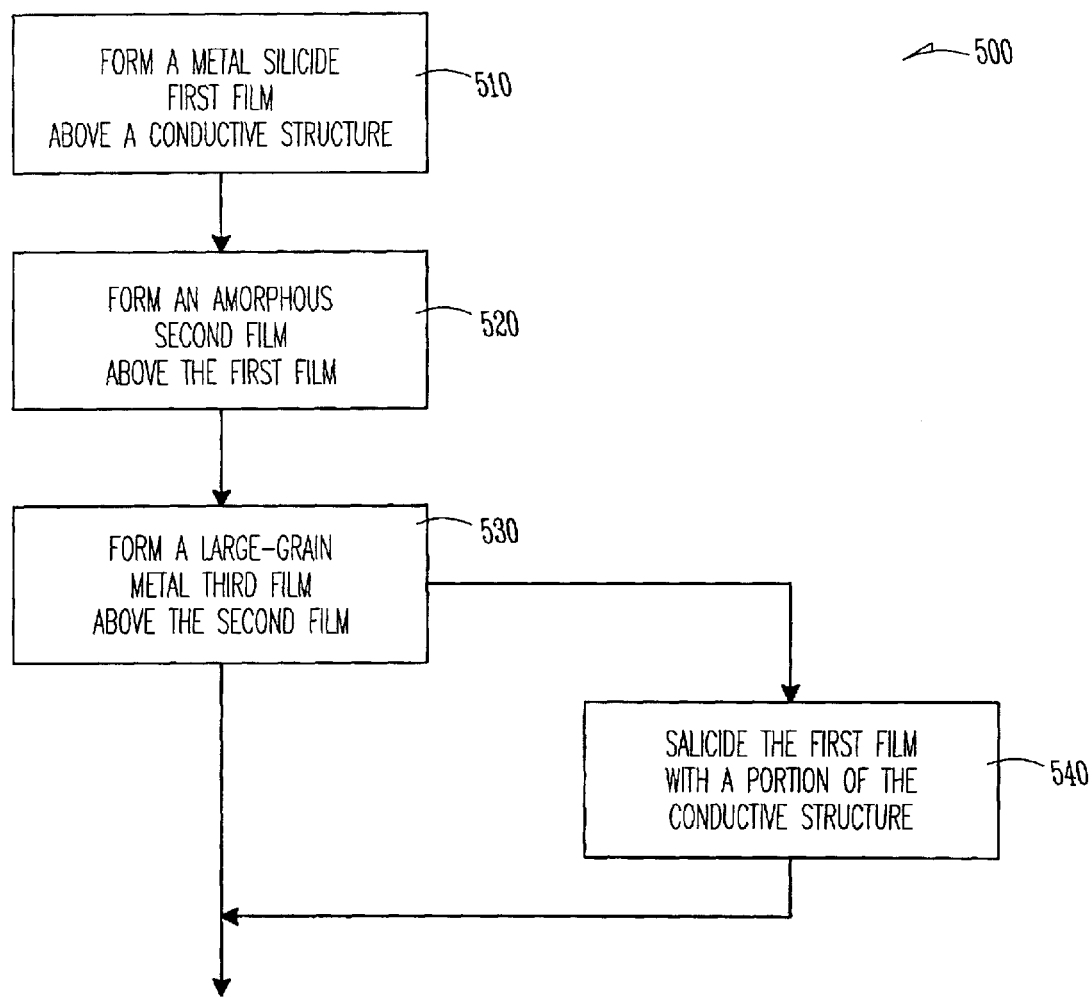
FIG. 5 is a process flow diagram according to an embodiment.

FIG. 5 is a process flow diagram 500 according to an embodiment. The embodiments referred to in FIGS. 2A–2C and FIGS. 4A–4B may be referred to according to the process flows. At 510, a metal silicide first film is formed above an active area of a substrate. In one embodiment, the active area is coupled to the first film through a polysilicon plug or other conductive body. In another embodiment, the active area is coupled to the first film through a S/D structure.

At 520, an ARM compound second film is formed above the first film. At 530, a large-grained metal third film is formed above the ARM compound second film. The large grain size is quantified by comparison to a characteristic dimension of the conductive structure. The process is complete at 530 in one embodiment.

At 540, the process is alternatively extended by saliciding the first film and the conductive structure. According to this embodiment, the process flow is complete at 540.

FIGS. 6 through 11 illustrate other embodiments. The processes and structures that are achieved in the various embodiments are inventively applicable to a variety of devices and apparatuses. Specific systems can be made by process embodiments, or that include an embodiment or embodiments of the structure. For example, a chip package can contain a BDL structure and/or an S/D structure according to an embodiment. In another example, the BDL structure and/or an S/D structure is used for electrical coupling for incidental, non-memory applications such as a line for a sense amplifier, or a trace between active devices on a substrate. In one embodiment, an array of BDL structures and/or S/D structures is included such as a line of sense amplifiers that use the BDL structures and/or the S/D structures. In another embodiment, the BDL structure and/or the S/D structure is part of a 2-dimensional array of storage devices such as a DRAM array. In another embodiment, the BDL structure and/or the S/D structure is part of an electrical device that includes the semiconductor substrate in a chip package and the chip package is part of a memory module or part of a chipset. In another embodiment, the memory module is part of a DRAM module that is inserted into a host such as a motherboard or a digital computer. In another embodiment, specific systems can be made that include the BDL structure and/or the S/D structure. For example, a chip package may contain a substrate such as one set forth in this disclosure. In another embodiment, the BDL structure and/or the S/D structure is part of an electrical device that includes the semiconductor substrate in a chip package and the chip package is part of a memory module or part of a chipset. In another embodiment, the memory module is part of a dynamic random access memory module that is inserted into a host such as a motherboard or a digital computer. In another embodiment, the BDL structure and/or the S/D structure is part of an electronic system. In another embodiment, the BDL structure and/or the S/D structure is fabricated with a floating gate. In another embodiment, the BDL structure and/or the S/D structure is fabricated with a floating gate that is part of a flash memory device that in turn is part of a chipset such as a basic input-output system ("BIOS") for an electrical device.

Figure 6:
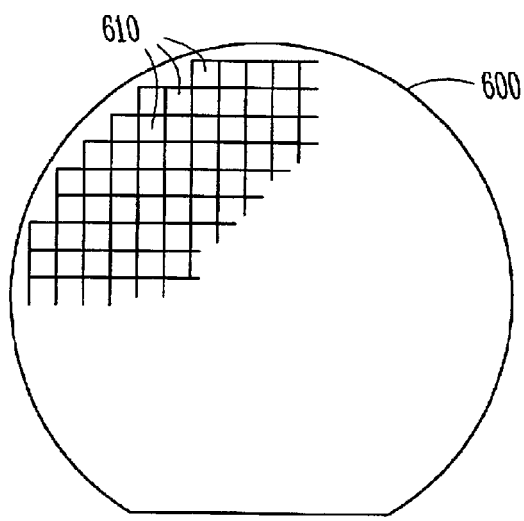
FIG. 6 is a top view of a wafer or substrate containing semiconductor dies in accordance with an embodiment.

FIG. 6 is a top view of a wafer 600 or substrate containing semiconductor dies in accordance with an embodiment. With reference to FIG. 6, a semiconductor die 610 is produced from the silicon wafer 600 that contains at least one of the BDL structures such as are depicted in FIGS. 2A–2C. Alternatively, the semiconductor die 610 is produced from the silicon wafer 600 that contains at least one of the S/D structure such as are depicted in FIGS. 4A–4B. A die 610 is an individual pattern, typically rectangular, on a substrate such as substrate 110 (FIG. 1) or a substrate 310 (FIG. 3) that contains circuitry to perform a specific function. A semiconductor wafer 600 will typically contain a repeated pattern of such dies 610 containing the same functionality. The die 610 can further contain additional circuitry to extend to such complex devices as a monolithic processor with multiple functionality. The die 610 is typically packaged in a protective casing (not shown) with leads extending therefrom (not shown) providing access to the circuitry of the die 610 for unilateral or bilateral communication and control. In one embodiment, the die 610 is incased in a host such as a chip package (not shown) such as a chip-scale package (CSP).

Figure 7:
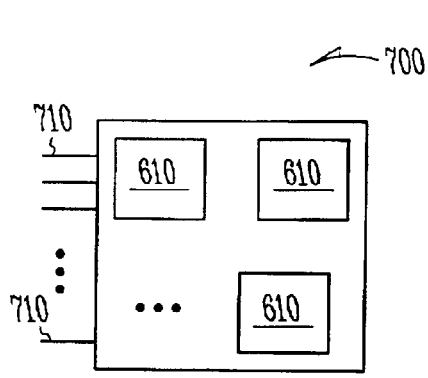
FIG. 7 is a block diagram of a circuit module in accordance with an embodiment.

FIG. 7 is a block diagram of a circuit module 700 in accordance with an embodiment. As shown in FIG. 7, two or more dies 610 at least one of which contains at least one of a BDL structure or a S/D stack structure such as are depicted in FIGS. 2A–2C and FIGS. 4A–4B, respectively in accordance with various embodiments may be combined, with or without protective casing, into a host such as a circuit module 700 to enhance or extend the functionality of an individual die 610. Circuit module 700 can be a combination of dies 610 representing a variety of functions, or a combination of dies 610 containing the same functionality. Some examples of a circuit module 700 include memory modules, device drivers, power modules, communication modems, processor modules and application-specific modules and can include multi-layer, multi-chip modules. Circuit module 700 may be a sub-component of a variety of electronic systems, such as a clock, a television, a cell phone, a personal computer, an automobile, an industrial control system, an aircraft, a hand-held, and others. Circuit module 700 will have a variety of leads 710 extending therefrom providing unilateral or bilateral communication and control. In another embodiment, circuit module 700 includes the structure depicted in FIG. 1 as a two-cell precursor that will be fabricated into a storage device. In yet another embodiment, circuit module 700 includes the structure depicted in FIG. 3 as a MOSFET array precursor that will be fabricated into an electronic device.

Figure 8:
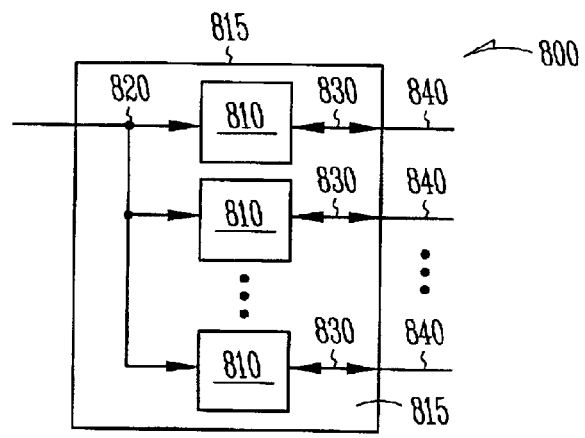
FIG. 8 is a block diagram of a memory module in accordance with an embodiment.

FIG. 8 is a block diagram of a memory module 800 in accordance with an embodiment. FIG. 8 shows one embodiment of a circuit module as a memory module 800 containing a BDL structure embodiment such as are depicted in FIGS. 2A–2C or the two-cell storage device precursor (after further processing that is known in the art, but not illustrated) as is depicted in FIG. 1. FIG. 8 alternatively/additionally shows one embodiment of a circuit module as a memory module 800 containing a S/D structure embodiment as are depicted in FIGS. 4A–4B or the MOSFET array precursor (after further processing that is known in the art, but not illustrated) as is depicted in FIG. 3. Memory module 800 is a host that generally depicts a Single In-line Memory Module (SIMM) or Dual In-line Memory Module (DIMM). A SIMM or DIMM may generally be a printed circuit board ("PCB") or other support containing a series of memory devices. While a SIMM will have a single in-line set of contacts or leads, a DIMM will have a set of leads on each side of the support with each set representing separate I/O signals. Memory module 800 contains multiple memory devices 810 contained on a support 815, the number depending upon the desired bus width and the desire for parity. Memory module 800 can contain memory devices 810 on both sides of support 815. Memory module 800 accepts a command signal from an external controller (not shown) on a command link 820 and provides for data input and data output on data links 830. The command link 820 and data links 830 are connected to leads 840 extending from the support 815. Leads 840 are shown for conceptual purposes and are not limited to the positions shown in FIG. 8.

Figure 9:
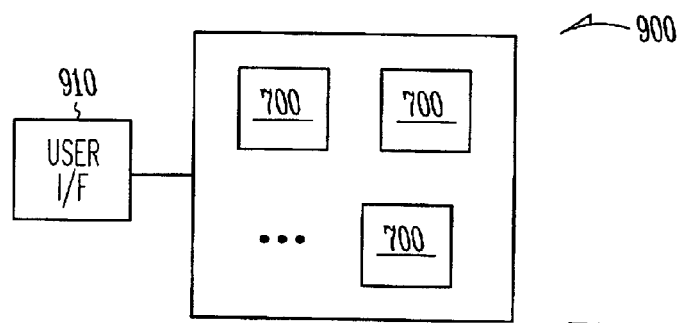
FIG. 9 is a block diagram of an electronic system in accordance with another embodiment the present invention.

FIG. 9 is a block diagram of an electronic system 900 in accordance with another embodiment the present invention. FIG. 9 shows another host type such as an electronic system 900 containing one or more circuit modules 700 as described above containing at least one of the BDL structures or one of the S/D structures. Electronic system 900 generally contains a user interface 910. User interface 910 provides a user of the electronic system 900 with some form of control or observation of the results of the electronic system 900. Some examples of user interface 910 include the keyboard, pointing device, monitor and printer of a personal computer; the tuning dial, display and speakers of a radio; the ignition switch of gas pedal of an automobile; and the card reader, keypad, display and currency dispenser of an automated teller machine. User interface 910 can further describe access ports provided to electronic system 900. Access ports are used to connect an electronic system to the more tangible user interface components previously exemplified. One or more of the circuit modules 700 can be a processor providing some form of manipulation, control or direction of inputs from or outputs to user interface 910, or of other information either preprogrammed into, or otherwise provided to, electronic system 900. As will be apparent from the lists of examples previously given, electronic system 900 will often contain certain mechanical components (not shown) in addition to the circuit modules 700 and user interface 710. It will be appreciated that the one or more circuit modules 700 in electronic system 900 can be replaced by a single integrated circuit. Furthermore, electronic system 900 may be a sub-component of a larger electronic system.

Figure 10:
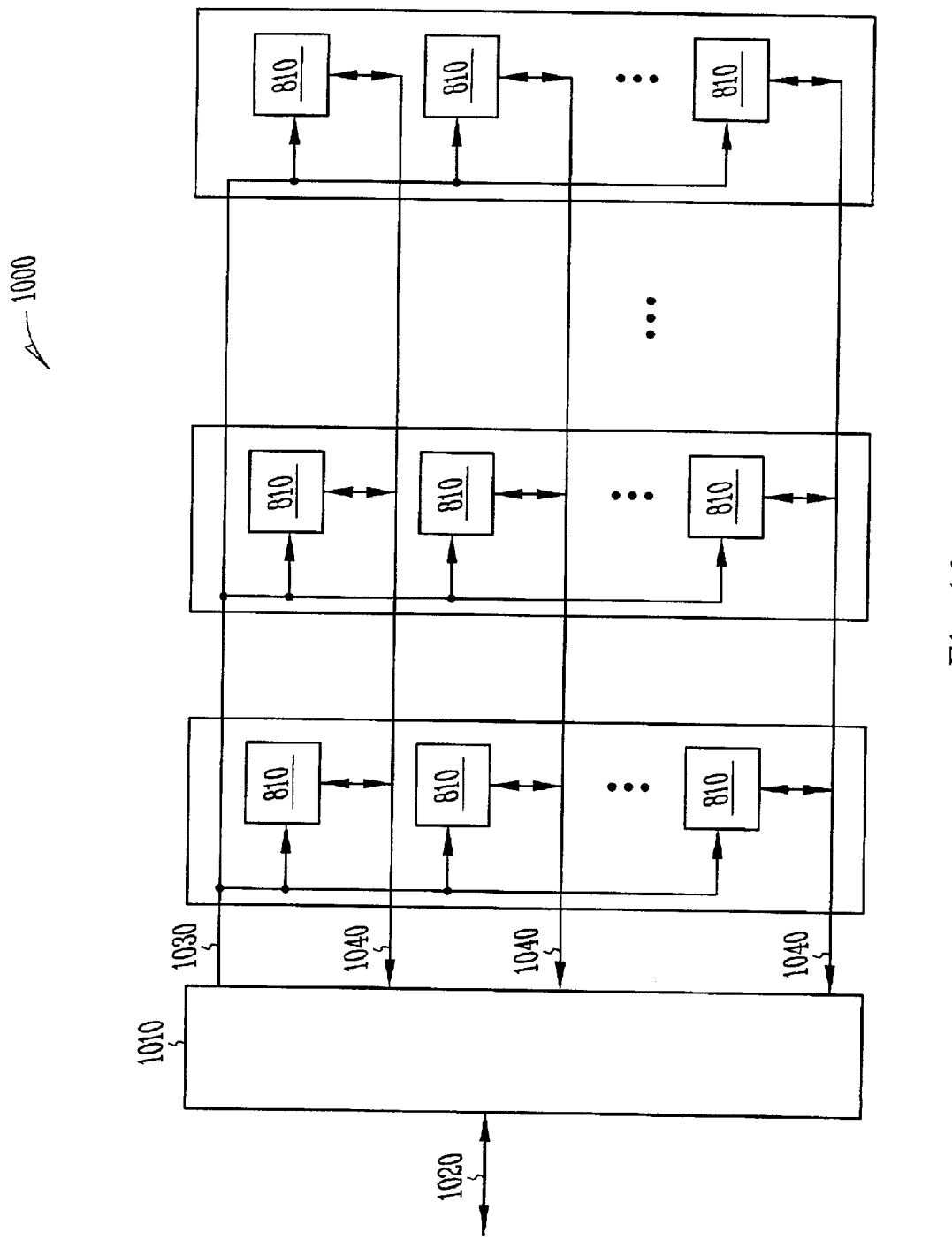
FIG. 10 is a block diagram of a memory system in accordance with an embodiment.

FIG. 10 is a block diagram of a memory system 1000 in accordance with an embodiment. FIG. 10 shows one embodiment of an electrical device at a system level. Memory system 1000 acts as a higher-level host that contains one or more memory devices 810 as described above including at least one of the BDL structures and/or one of the S/D structures as set forth herein in accordance with various embodiments, and a memory controller 1010 that can also include circuitry that is connected with a buried digit line structure as set forth herein. Memory controller 1010 provides and controls a bidirectional interface between memory system 1000 and an external system bus 1020. Memory system 1000 accepts a command signal from the external system bus 1020 and relays it to the one or more memory devices 810 on a command link 1030. Memory system 1000 provides for data input and data output between the one or more memory devices 810 and external system bus 1020 on data links 1040.

Figure 11:
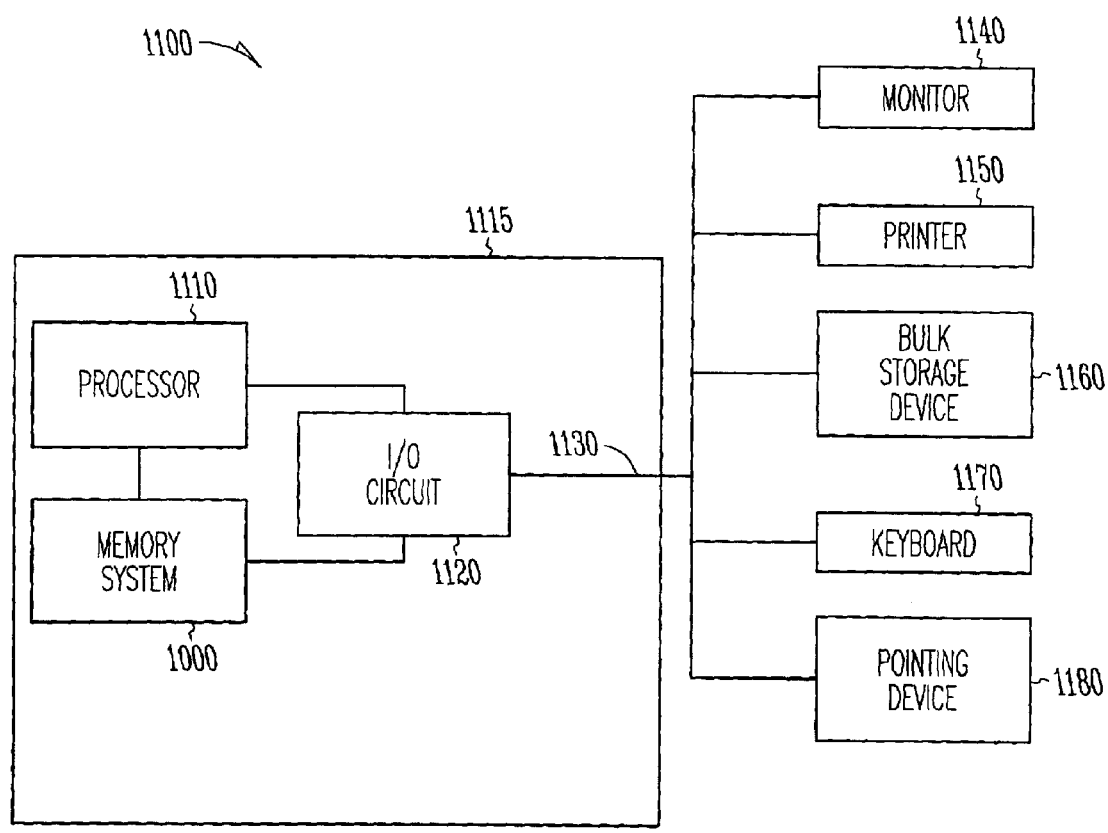
FIG. 11 is a block diagram of a computer system in accordance with an embodiment.

FIG. 11 is a block diagram of a computer system 1100 in accordance with an embodiment. FIG. 11 shows a further embodiment of an electronic system as a computer system 1100. Computer system 1100 contains a processor 1110 and a memory system 1000 housed in a computer unit 1115. Computer system 1100 is but one example of an electronic system containing another electronic system, i.e. memory system 1000, as a sub-component. The computer system 1100 can contain an input/output (I/O) circuit 1120 that is coupled to the processor 1110 and the memory system 1000. Computer system 1100 optionally contains user interface components that are coupled to the I/O circuit 1120. In accordance with the present invention a plurality of BDL structures and/or S/D structures can each be coupled to one of a plurality of I/O pads or pins 1130 of the I/O circuit 1120. The I/O circuit 1120 can then be coupled a monitor 1140, a printer 1150, a bulk storage device 1160, a keyboard 1170 and a pointing device 1180. It will be appreciated that other components are often associated with computer system 1100 such as modems, device driver cards, additional storage devices, etc. It will further be appreciated that the processor 1110, memory system 1000, I/O circuit 1120 and partially isolated structures or data storage devices of computer system 1100 can be incorporated on a single integrated circuit. Such single package processing units reduce the communication time between the processor 1110 and the memory system 1100.

CONCLUSION

Thus has been shown a structure including three films that are used in a buried digit line stack and in a source/drain contact stack. The buried digit line stack includes a large-grained metal film that achieves a lowered resistivity in accordance with improved resistivity needs. The buried digit line stack and/or the source/drain contact stack can be fabricated in a single PVD tool such that no more than a single tool-prep is required. According to the structure itself, nitrogen migration is sequestered into an amorphous salicide structure.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description of Embodiments of the Invention, with each claim standing on its own as a separate specific embodiment. While various embodiments have been described and illustrated with respect to forming buried digit line structures and source/drain contact structures, it should be apparent that the same processing techniques can be used to form other structures by the stacked film techniques set forth in this disclosure for other applications. Furthermore, the processes described herein may be used in the development of other three-dimensional semiconductor structures, as well as in the development of other semiconductor structures, such as gates, interconnects, contact pads, and more.

Although specific embodiments have been illustrated and described herein, it will be appreciated by those of ordinary skill in the art that any arrangement which is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A process comprising:
   physical vapor deposition forming a refractory metal silicide first film above a conductive structure;
   forming an amorphous refractory metal (ARM) nitride second film above the refractory metal suicide first film;
   forming a refractory metal third film above the ARM nitride second film;
   treating the first film, the second film, and the third film to form a crystalline salicide first structure above the conductive structure, a nitrogen-containing amorphous salicide second structure above the crystalline salicide first structure, and a nitrogen-denuded refractory metal third film.

2. The process according to claim 1, wherein the conductive structure includes a characteristic dimension, and wherein forming the refractory metal third film is carried out under conditions to cause an average grain size therein, wherein the average grain size is in a range from about one-twentieth the conductive structure characteristic dimension to larger than the conductive structure characteristic dimension.

3. The process according to claim 1, wherein the conductive structure includes a polysilicon plug that is coupled to an active area of a substrate, and wherein the process further includes:
   forming a buried digit line stack with electrical coupling through the crystalline salicide first structure, the amorphous salicide second structure, and the refractory metal third film.

4. The process according to claim 1, wherein the conductive structure includes a source/drain structure that is coupled to an active area of a substrate, and wherein the process further includes:
   forming a source/drain contact stack with electrical coupling through the crystalline salicide first structure, the amorphous salicide second structure, and the refractory metal third film.

5. The process according to claim 1, wherein treating the first film, the second film, and the third film results in a metal-annexed third film, and a nitrogen-containing amorphous salicide second structure.

6. The process according to claim 1, wherein treating the first film, the second film, and the third film results in a metal-alloy-annexed third film, and a nitrogen-containing amorphous salicide second structure.

7. The process according to claim 1, wherein treating the first film, the second film, and the third film results in a metal-eutectic-annexed third film, and a nitrogen-containing amorphous salicide second structure.

8. The process according to claim 1, wherein treating the first film, the second film, and the third film results in a metal-metal-annexed third film, and a nitrogen-containing amorphous salicide second structure.

9. The process according to claim 1, wherein forming an ARM nitride second film above the refractory metal silicide first film is carried out by physical vapor deposition.

10. The process according to claim 1, wherein forming the first film, forming the second film, and forming the third film are carried out in a single tool.

11. A process of forming a buried digit line stack comprising:
    physical vapor deposition forming a refractory metal silicide first film above a polysilicon plug, wherein the refractory metal silicide first film is according to MSix, wherein M is selected from Ta, TaTi, W, Mo, MoTi, Hf, HfTi, TaW, TaWTi, TaMo, TaMoTi, TaHf, TaHfTi, WTi, WMo, WMoTi, WHf, WHfTi, MoHf, and MoHfTi, and wherein $0 < x \leq 3$;
    forming an amorphous refractory metal (ARM) nitride second film above the refractory metal silicide first film;
    forming a refractory metal third film above the ARM nitride second film;
    treating the first film, the second film, and the third film to form a crystalline salicide first structure above the polysilicon plug, a nitrogen-containing amorphous salicide second structure above the crystalline salicide first structure, and a nitrogen-denuded refractory metal third film above the amorphous salicide second structure.

12. The process according to claim 11, the process further including:
    forming a cap layer above the nitrogen-denuded refractory metal third film.

13. The process according to claim 11, the process further including:
    forming a nitride cap layer above the nitrogen-denuded refractory metal third film; and
    forming a spacer in contact with the third film, the amorphous salicide second structure, and optionally the crystalline salicide first structure.

14. The process according to claim 11, wherein treating the first film, the second film, and the third film is carried out at a temperature range from about 650° C. to about 850° C.

15. The process according to claim 11, wherein treating the first film, the second film, and the third film further includes:
    a heating at a temperature range sufficient to cause nitrogen denuding from the ARM nitride second film, to form the amorphous salicide second structure, and to hinder nitrogen migration into the crystalline salicide first structure.

16. A process of forming a source/drain (S/D) contact stack comprising:

physical vapor deposition forming a refractory metal silicide first film above an S/D region of a substrate active area, wherein the refractory metal silicide first film is according to MSix, wherein M is selected from Ta, TaTi, W, Mo, MoTi, Hf, HfTi, TaW, TaWTi, TaMo, TaMoTi, TaHf, TaHfTi, WTi, WMo, WMoTi, WHf, WHfTi, MoHf, and MoHfTi, and wherein $0<x \leq 3$;

forming an amorphous refractory metal (ARM) nitride second film above the refractory metal silicide first film;

forming a refractory metal third film above the ARM nitride second film; and treating the first film, the second film, and the third film to form a crystalline salicide first structure above the (S/D) region, a nitrogen-containing amorphous salicide second structure above the crystalline salicide first structure, and a nitrogen-denuded refractory metal third film above the amorphous salicide second structure.

17. The process according to claim 16, wherein the S/P, structure has an S/D junction thickness, and wherein treating is carried out under conditions to cause consumption of a portion of the S/D structure in a range from about one-tenth the S/D junction thickness to about one-half the S/D junction thickness.

18. The process according to claim 16, wherein the S/D structure has an S/D junction thickness, and wherein treating is carried out under conditions to cause consumption of about one-third the S/D junction thickness or less.

19. The process according to claim 16, the process further including:

forming a contact that is electrically coupled to the nitrogen-denuded refractory metal third film.

20. The process according to claim 16, the process further including:

forming a bulk dielectric layer over the nitrogen-denuded refractory metal third film; and forming a contact through the bulk dielectric layer, wherein the contact is electrically coupled to the nitrogen-denuded refractory metal third film.

21. The process according to claim 16, wherein treating the first film, the second film, and the third film is carried out at a temperature range from about 650° C. to about 850° C.

22. The process according to claim 16, wherein treating the first film, the second film, and the third film further includes:

a heating at a temperature range sufficient to cause nitrogen denuding from the ARM nitride second film, to form the crystalline salicide first structure, and to form a nitrogen-containing amorphous salicide second structure.

* * * * *

UNITED STATES PATENT AND TRADEMARK OFFICE
CERTIFICATE OF CORRECTION

PATENT NO. : 6,835,659 B2
DATED : December 28, 2004
INVENTOR(S) : Hu

It is certified that error appears in the above-identified patent and that said Letters Patent is hereby corrected as shown below:

Title page,
Item [56], References Cited, OTHER PUBLICATIONS,
after "388" delete ";".

Column 2,
Line 8, after "module" delete "," and insert -- . --, therefor.

Column 7,
Lines 9-10, delete "metal-metal annexed third film" and insert
-- metal-metal-annexed third film --, therefor.

Column 17,
Line 38, delete "suicide" and insert -- silicide --, therefor.

Column 19,
Line 24, delete "S/P" and insert -- S/D --, therefor.

Signed and Sealed this

Thirty-first Day of May, 2005

JON W. DUDAS
*Director of the United States Patent and Trademark Office*